(12) United States Patent
Jeong et al.

(10) Patent No.: US 9,667,381 B2
(45) Date of Patent: May 30, 2017

(54) PACKET DECODING METHOD AND APPARATUS

(71) Applicants: Samsung Electronics Co., Ltd., Suwon-si, Gyeonggi-do (KR); SUNGKYUNKWAN UNIVERSITY RESEARCH & BUSINESS FOUNDATION, Suwon-si, Gyeonggi-do (KR)

(72) Inventors: Hongsil Jeong, Suwon-si (KR); Sang-Hyo Kim, Seoul (KR); Jong-Hwan Kim, Suwon-si (KR); Daehyeon Ryu, Seongnam-si (KR); Seho Myung, Seoul (KR)

(73) Assignees: Samsung Electronics Co., Ltd., Suwon-si (KR); Sungkyunkwan University Research & Business Foundation, Suwon-si (KR)

(*) Notice: Subject to any disclaimer, the term of this patent is extended or adjusted under 35 U.S.C. 154(b) by 629 days.

(21) Appl. No.: 14/105,930

(22) Filed: Dec. 13, 2013

(65) Prior Publication Data
US 2014/0169388 A1    Jun. 19, 2014

(30) Foreign Application Priority Data
Dec. 14, 2012  (KR) .......................... 10-2012-0146579

(51) Int. Cl.
*H03M 13/00*    (2006.01)
*H04B 7/216*    (2006.01)
(Continued)

(52) U.S. Cl.
CPC .......... *H04L 1/0046* (2013.01); *H03M 13/09* (2013.01); *H03M 13/1111* (2013.01);
(Continued)

(58) Field of Classification Search
None
See application file for complete search history.

(56) References Cited

U.S. PATENT DOCUMENTS 7,571,372 B1 * 8/2009 Burd ................. G11B 20/1833
                                                714/769
7,814,394 B2 * 10/2010 Lee .................. H03M 13/3738
                                                714/758
(Continued)

FOREIGN PATENT DOCUMENTS

WO  89/04091 A1   5/1989
WO  2009/104039 A1  8/2009

*Primary Examiner* — Alpus H Hsu
(74) *Attorney, Agent, or Firm* — Jefferson IP Law, LLP

(57) ABSTRACT

A method and an apparatus for encoding and decoding packets using a polar code is provided. The method includes acquiring a plurality of blocks constituting the packet, extracting a plurality of codeword candidates corresponding to the blocks, selecting some of the codeword candidates in a descending order of posterior probability among the codeword candidates corresponding to the blocks, combining the selected codeword candidates into a plurality of codeword combinations, selecting a codeword combination having the highest posterior probability and passed Cyclic Redundancy Check (CRC) test without error among the plurality of codeword combinations, and decoding the selected codeword combination. The packet encoding and decoding apparatus and method of the present disclosure is capable of encoding and decoding packets in a unit of blocks efficiently.

12 Claims, 19 Drawing Sheets

(51) Int. Cl.
*H04J 3/24* (2006.01)
*H04L 1/00* (2006.01)
*H03M 13/09* (2006.01)
*H03M 13/11* (2006.01)
*H03M 13/13* (2006.01)
*H03M 13/29* (2006.01)
*H03M 13/45* (2006.01)

(52) U.S. Cl.
CPC ....... *H03M 13/1191* (2013.01); *H03M 13/13* (2013.01); *H03M 13/2906* (2013.01); *H03M 13/451* (2013.01); *H04L 1/0057* (2013.01)

(56) References Cited

U.S. PATENT DOCUMENTS

| | | | |
|---|---|---|---|
| 8,020,070 B2 * | 9/2011 | Langner | H03M 13/11 714/752 |
| 8,196,016 B1 * | 6/2012 | Langner | H03M 13/11 714/758 |
| 8,271,862 B2 * | 9/2012 | Kobayashi | G11B 20/1833 714/786 |
| 8,665,970 B2 * | 3/2014 | Larsson | H04L 1/0046 375/242 |
| 9,077,530 B2 * | 7/2015 | Larsson | H04L 1/1664 |
| 9,178,532 B2 * | 11/2015 | Li | H03M 13/09 |
| 2002/0116681 A1 * | 8/2002 | Amrani | H03M 13/29 714/792 |
| 2003/0026346 A1 | 2/2003 | Matsumoto et al. | |
| 2010/0091697 A1 | 4/2010 | Vucetic et al. | |
| 2010/0146372 A1 * | 6/2010 | Tomlinson | H03M 13/293 714/780 |
| 2011/0116583 A1 | 5/2011 | Simmons et al. | |
| 2012/0159282 A1 * | 6/2012 | Ito | H03M 13/2966 714/758 |
| 2014/0019820 A1 * | 1/2014 | Vardy | H03M 13/13 714/752 |

* cited by examiner

PACKET DECODING METHOD AND APPARATUS

PRIORITY

This application claims the benefit under 35 U.S.C. §119 (a) of a Korean patent application filed on Dec. 14, 2012 in the Korean Intellectual Property Office and assigned Serial number 10-2012-0146579, the entire disclosure of which is hereby incorporated by reference.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) SAMSUNG ELECTRONICS CO., LTD. and 2) SUNGKYUNKWAN UNIVERSITY RESEARCH & BUSINESS FOUNDATION.

TECHNICAL FIELD

The present disclosure relates to a data packet decoding method and apparatus. More particularly, the present disclosure relates to a method and an apparatus for encoding and decoding packets using a polar code.

BACKGROUND

It is imperative to transmit information without any loss in data communication. In a wireless communication system, however, a radio signal carrying information is distorted due to noises, multipath fading, interferences, and the like. Therefore, there have been many studies on error-correcting codes to improve signal reception reliability with the addition of well-controlled redundant information.

The polar code has been proposed first in 2008. The polar code is characterized by low coding and decoding complexity. The polar code is the first error correction code proved to be able to achieve the Shannon's channel capacity as a theoretical limit on the general Binary-input Discrete Memoryless symmetric Channel (B-DMC).

Meanwhile, the Successive Cancellation (SC) decoder proposed to decode the polar code has shown inferiority as compared to the Low-Density Parity Check (LDPC) code and Turbo code in SC decoding performance on the polar code having a finite code length N. Recently, a Successive Cancellation List (SCL) decoder has been proposed in order to overcome this performance inferiority.

The SCL decoder is an expanded SC decoder so as to decode the message bits successively through successive cancellation like the SC decoder. However, unlike the SC decoder having one decoding path, the SCL decoder has L decoding paths that are managed in a list and selects a codeword corresponding to one of L decoding paths. The codeword selection is performed under the rule of selecting the codeword having the highest posterior probability.

FIG. 1 is a graph illustrating a polar code decoding performance of an SCL decoder according to the related art.

Referring to FIG. 1, the horizontal axis denotes channel quality (($E_b/N_0$)) and the vertical axis denotes the Bit-Error Rate (BER). FIG. 1 shows an error floor region 110 and a waterfall region 120.

Referring to FIG. 1, the decoding performance of the SCL decoder increases as the size L of the SCL decoder increases. As shown in FIG. 1, however, the decoding performance of the SCL decoder on the polar code having the finite code length N shows the error floor region 110. This is because the linear code generated according to the normal polar code generation method has a relatively short minimum distance.

FIG. 2 is a block diagram illustrating a configuration of a Cyclic Redundancy Check (CRC)-polar code concatenation encoder according to the related art.

Referring to FIG. 2, as one of the approaches to address the aforementioned issue of the SCL decoder, a method of concatenating a CRC code and a polar code has been proposed. A CRC-α coder 220 is a kind of error detection code. A message 210 is CRC-coded by the CRC-α coder 220 and polar-coded by a polar coder 230. Such coding operations are performed by a CRC-polar concatenation encoder 240.

FIG. 3 is a graph illustrating decoding performance of an encoder according to the related art.

Referring to FIG. 3, the horizontal axis denotes the channel quality ($E_b/N_0$) and the vertical axis denotes the BER.

As shown in FIG. 3, the error floor region is overcome with the concatenation of the polar code and the CRC code.

The CRC code assists the SCL decoder to select a codeword corresponding to one of L decoding paths as the decoding results of the SCL decoder. The SCL decoder implemented by concatenating the CRC code with the polar coder removes the codewords that failed to pass the CRC test and selects the codeword having the highest probability among the codewords that passed the CRC test.

Therefore, a need exists for a method and an apparatus for efficiently encoding and decoding packets using a polar code.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an efficient encoding and decoding method and apparatus.

In accordance with an aspect of the present disclosure, a method for decoding a packet including multiple blocks is provided. The method includes acquiring a plurality of blocks constituting the packet, extracting a plurality of codeword candidates corresponding to the blocks, selecting some of the plurality of codeword candidates in a descending order of posterior probability among the plurality of codeword candidates corresponding to the blocks, combining the selected codeword candidates into a plurality of codeword combinations, selecting a codeword combination having a highest posterior probability and passed Cyclic Redundancy Check (CRC) test without error among the plurality of codeword combinations, and decoding the selected codeword combination.

In accordance with another aspect of the present disclosure, an apparatus for decoding a packet including multiple blocks is provided. The apparatus includes a communication unit configured to receive a plurality of blocks constituting the packet and a control unit configured to acquire the plurality of blocks constituting the packet, to extract a plurality of codeword candidates corresponding to the blocks, to select some of the plurality of codeword candidates in a descending order of posterior probability among the plurality of codeword candidates corresponding to the blocks, to combine the selected codeword candidates into a plurality of codeword combinations, to select a codeword combination having a highest posterior probability and passed CRC test without error among the plural codeword combinations, and to decode the selected codeword combination.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
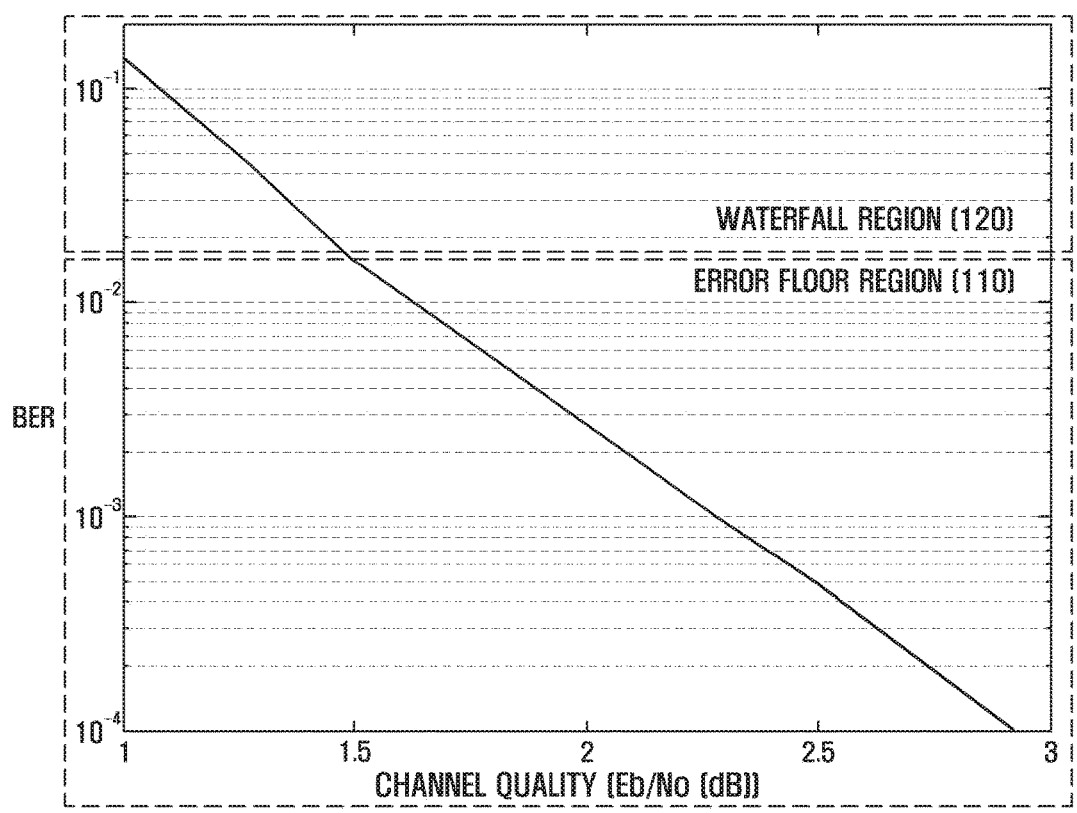
FIG. 1 is a graph illustrating a polar code decoding performance of a Successive Cancellation List (SCL) decoder according to the related art.
Figure 2:
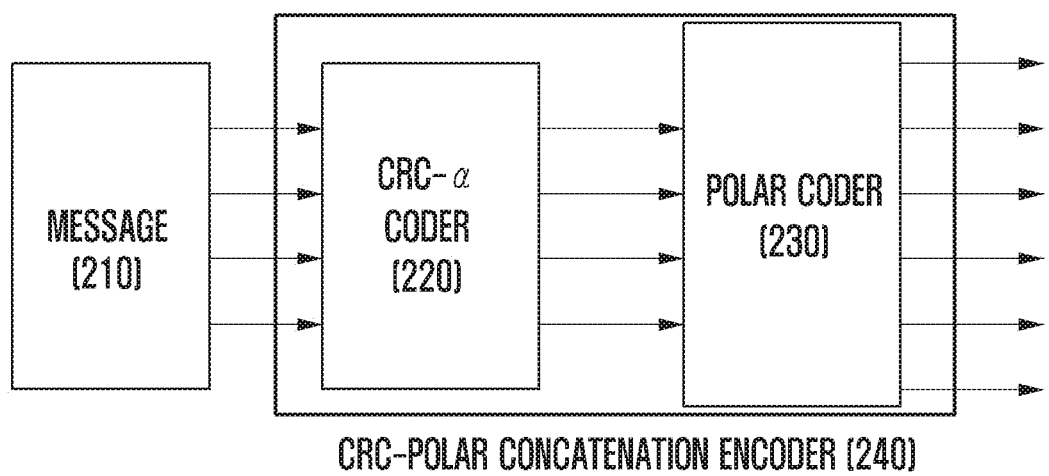
FIG. 2 is a block diagram illustrating a configuration of a Cyclic Redundancy Check (CRC)-polar code concatenation encoder according to the related art.
Figure 3:
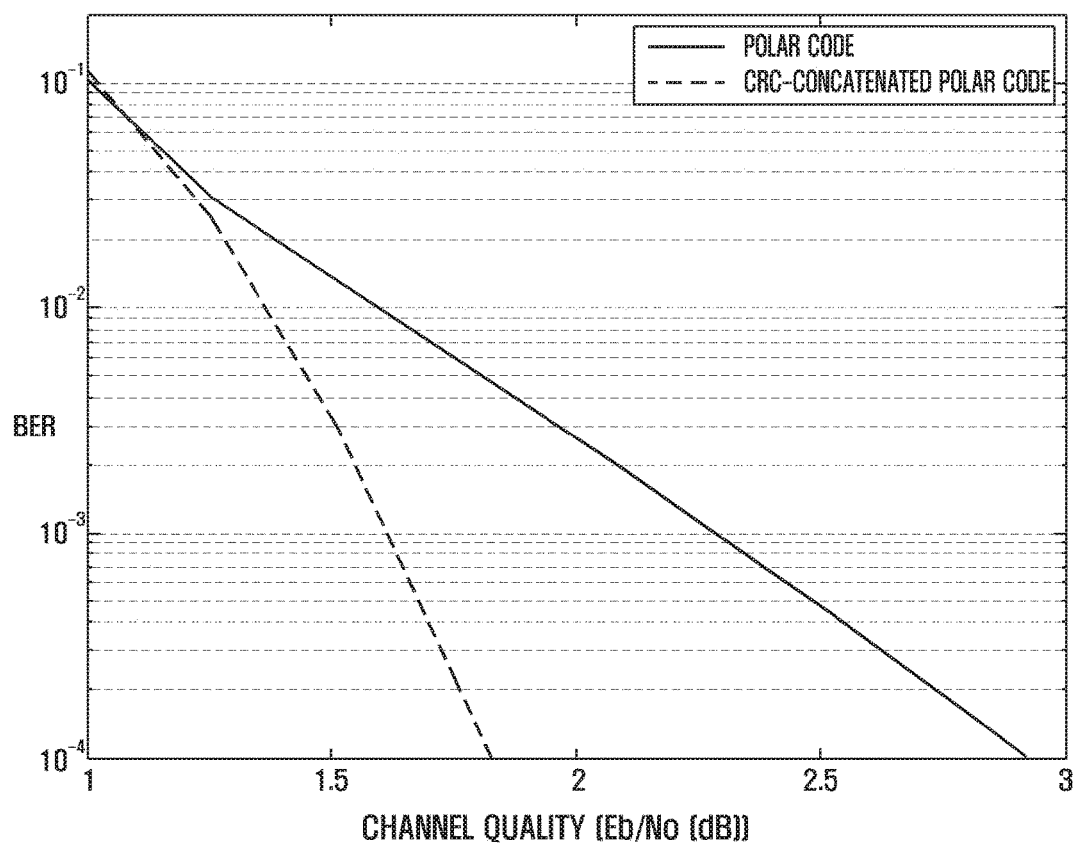
FIG. 3 is a graph illustrating decoding performance of an encoder according to the related art.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Some elements are exaggerated, omitted, or simplified in the drawings and the elements may have sizes and/or shapes different from those shown in drawings, in practice. The same reference numbers are used throughout the drawings to refer to the same or like parts.

An embodiment of the present disclosure is directed to a method for decoding polar codewords concatenated in a unit of packets using a Successive Cancellation List (SCL) decoder. The encoder/decoder uses a packet Cyclic Redundancy Check (CRC) code concatenated to the packet in CRC decoding instead of the CRC code concatenated to the polar codeword in a unit of blocks. The decoding method is capable of reducing the coding rate with the CRC code concatenated to each block, resulting in improvement of polar code decoding performance.

The packet decoding methods according to various embodiments of the present disclosure can be applied to various communication systems transmitting data in a unit of packets. Each packet is split into blocks and polar-coded to be transmitted to the recipient. The encoder/decoder according to an embodiment of the present disclosure removes the CRC code concatenated to each block to prevent coding rate loss so as to improve the packet decoding performance. The encoder does not concatenate the CRC code to each block in the coding process. The decoder does not perform codeword decoding on every block in the decoding procedure using the SCL decoder but leaves codeword candidates in size M so as to improve packet decoding performance using combinations of the codeword candidates.

A decoder which decodes codewords concatenated in a unit of packets. The large size information is split into multiple data units for facilitating transmission and such a data unit is called a packet. At this time, a CRC code is concatenated to each packet in order for the recipient to determine whether the received data is erroneous. In wireless data communication, when encoding a large packet, the packet is fragmented into multiple blocks which are coded respectively and then concatenated back together.

Figure 4A:
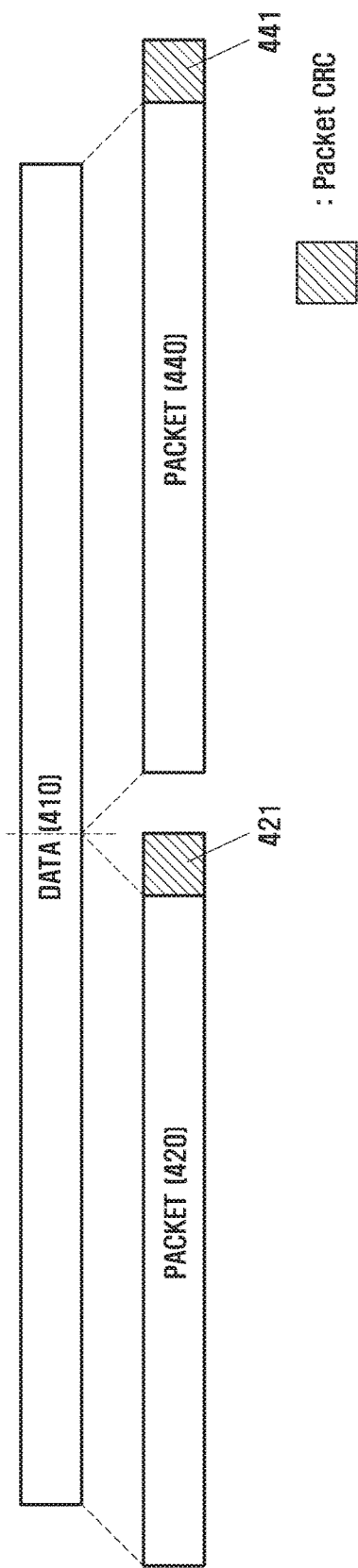
FIG. 4A is a diagram illustrating a segmentation of data into packets according to an embodiment of the present disclosure.

FIG. 4A is a diagram illustrating a segmentation of data into packets according to an embodiment of the present disclosure.

Figure 4B:
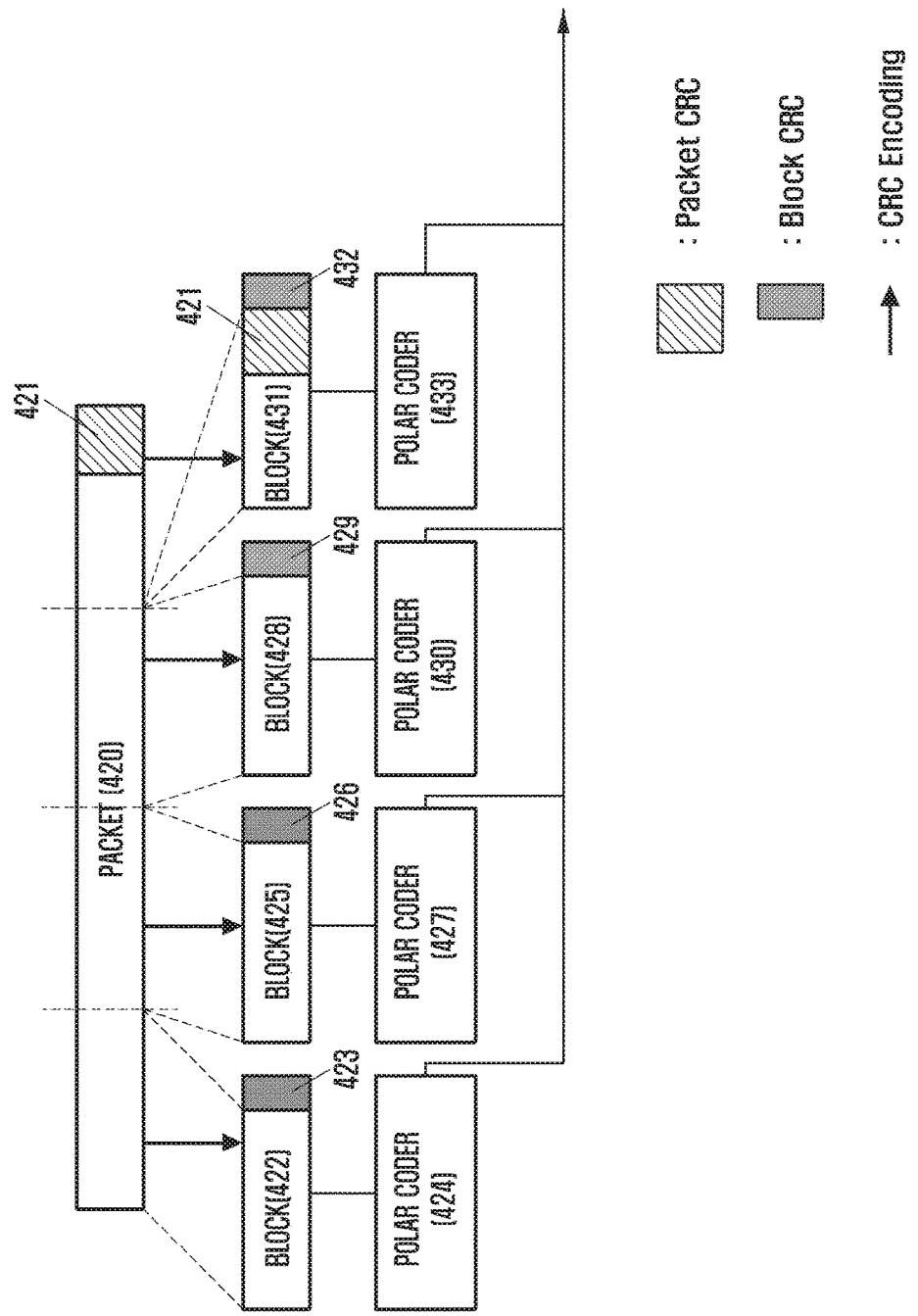
FIG. 4B is a diagram illustrating a principle of an encoding method according to an embodiment of the present disclosure.

FIG. 4B is a diagram illustrating a principle of an encoding method according to an embodiment of the present disclosure.

Referring to FIGS. 4A and 4B, information data 410 is segmented into packets 420 and 440, and each packet 420 is split into four blocks 422, 425, 428, and 431 which are coded by respective polar coders 424, 427, 430, and 433 and transmitted. The entire method is divided into a polar code encoding and decoding procedures.

Polar Code Encoding Procedure

The information data 410 to be transmitted by the transmitter is fragmented into multiple packets 420 and 440. A CRC code 421 is added to each fragment to form a packet 420. Each packet is segmented into a plurality of data blocks. For example, the packet 420 is split into the blocks 422, 425, 428, and 431. The CRC codes 423, 426, 429, and 432 are concatenated to the segments to form the blocks 422, 425, 428, and 431. The CRC codes 423, 426, 429, and 432 are used for maximizing the decoding performance of the polar code with the SCL decoder. The blocks 422, 425, 428, and 431 having the respective CRC codes 423, 426, 429, and 432 are polar coded by the respective polar coder 424, 427, 430, and 433 and transmitted to the receiver. The CRC codes 421 and 441 added to the respective packets are referred to as packet CRC codes, and the CRC codes 423, 426, 429, and 432 added to the respective blocks are referred to as block CRC codes.

Polar Code Decoding Procedure

Figure 4C:
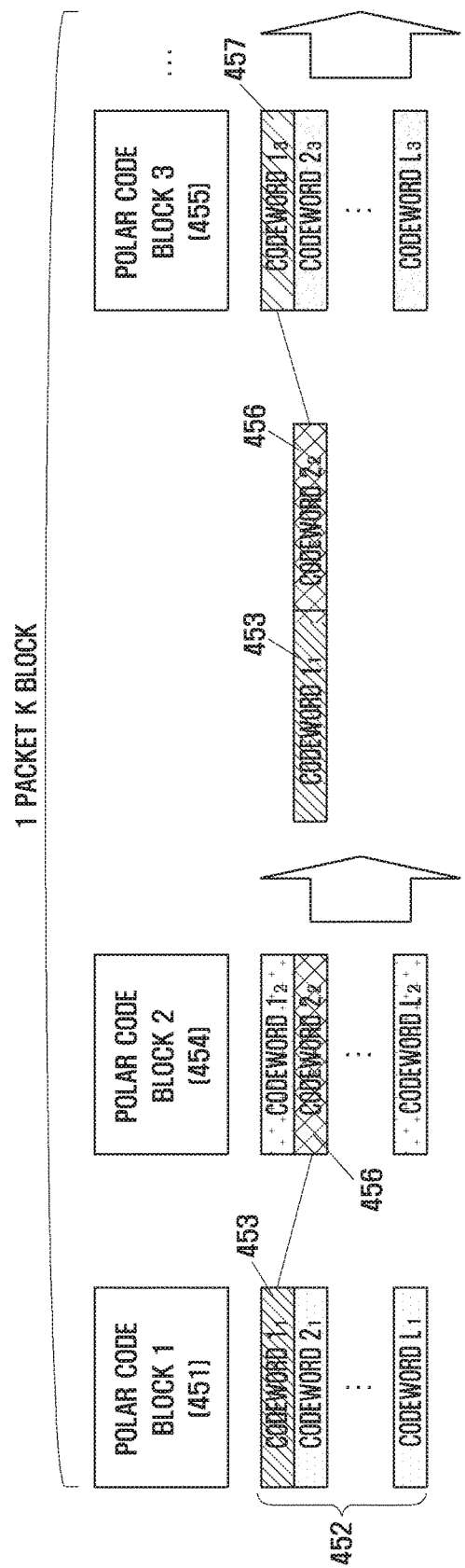
FIG. 4C is a diagram illustrating a decoding procedure according to an embodiment of the present disclosure.

FIG. 4C is a diagram illustrating a decoding procedure according to an embodiment of the present disclosure.

The packets 420 and 440 constituting the information data 410 are received by the receiver distorted due to the noise, multipath fading, interference, and the like. Accordingly, the signal carrying the packets is recovered through a decoding process. The received signal is decoded by using the SCL decoder. The SCL decoder generates L codeword candidates 452 to the signal vector (that is, a polar code block 451) received in a unit block. Among L codeword candidates 452, the codeword candidates in which any error is detected through CRC test with the block CRC code are removed. Among the codeword candidates that passed the CRC test, one codeword having the highest posterior probability (that is, probability in which the corresponding codeword is likely to be the correct codeword) is selected. The methods of obtaining the posterior probability have been well-known. Each packet is recovered by concatenating the codewords decoded from blocks 451, 454, and 455. The receiver detects for an error on the concatenated codewords using the packet CRC code. If an error is detected at a certain phase of the decoding procedure, the receiver sends the transmitter a Negative acknowledgement (NACK) to request for retransmission and, otherwise, an Acknowledgement (ACK).

Figure 5A:
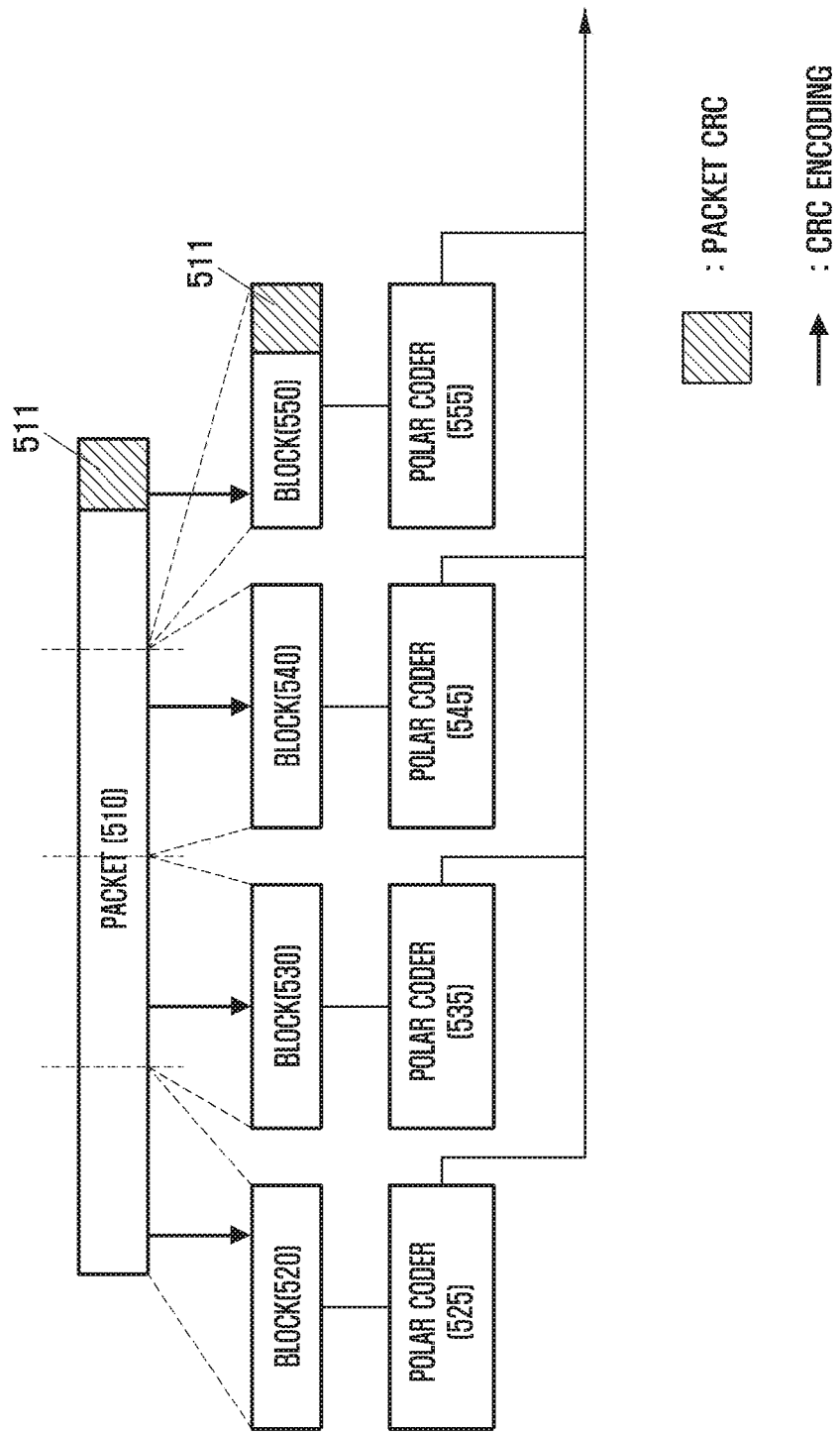
FIG. 5A is a diagram illustrating a principle of an encoding method according to an embodiment of the present disclosure.

Referring to FIG. 4C, a packet consists of K blocks. The blocks 451, 454, and 455 are the polar code blocks received by the receiver. The polar code blocks 451, 454, and 455 have the block CRC codes respectively. Each of the polar code blocks 451, 454, and 455 represents L codeword candidates 452 decoded by the SCL decoder, the codeword candidates 452 being depicted right below the corresponding polar code block. For example, the codeword candidates $1_k$ to $L_k$ below the $k^{th}$ block are the codeword candidates corresponding to the $k^{th}$ block. The L codeword candidates 452 are arranged from top to bottom in the highest posterior-probability first order. For example, the codeword $2_1$ denotes the codeword having the second highest posterior probability among the codeword candidates 452 of the polar code block 1 451. The shaded part, such as a codeword $1_1$ 453 of the polar code block 1 451, denotes the codeword selected as the transmitted codeword, and the non-shadowed part, such as codewords $2_1$ to $L_1$, denotes the codewords that are not selected. Each block is decoded in such a way of selecting the codeword having the highest posterior probability among the codeword candidates that passed the CRC test without error. The codewords 453, 456, and 457 decoded from the respective blocks in this way are concatenated for a packet as shown in FIG. 5A. The receiver detects for an error of the packet using the packet CRC code.

The technique of concatenating the CRC code in performing polar coding on the blocks of the data packet shows the best decoding performance in SCL decoding from the view point of a signal block. However, concatenating the CRC code to the individual blocks causes coding rate loss and thus, causes performance degradation from the view point of entire decoding performance. Since the packet CRC code is used for determining packet data integrity, this is also one of the causes of performance degradation. Therefore, there is a need of a more efficient encoding and decoding method.

The packet-based concatenation polar code decoding method according to an embodiment of the present disclosure is capable of performing SCL decoding with the packet CRC code instead of block CRC code concatenated to individual blocks which causes coding rate loss.

Polar Code Encoding Procedure

FIG. 5A is a diagram illustrating a principle of an encoding method according to an embodiment of the present disclosure.

Figure 5B:
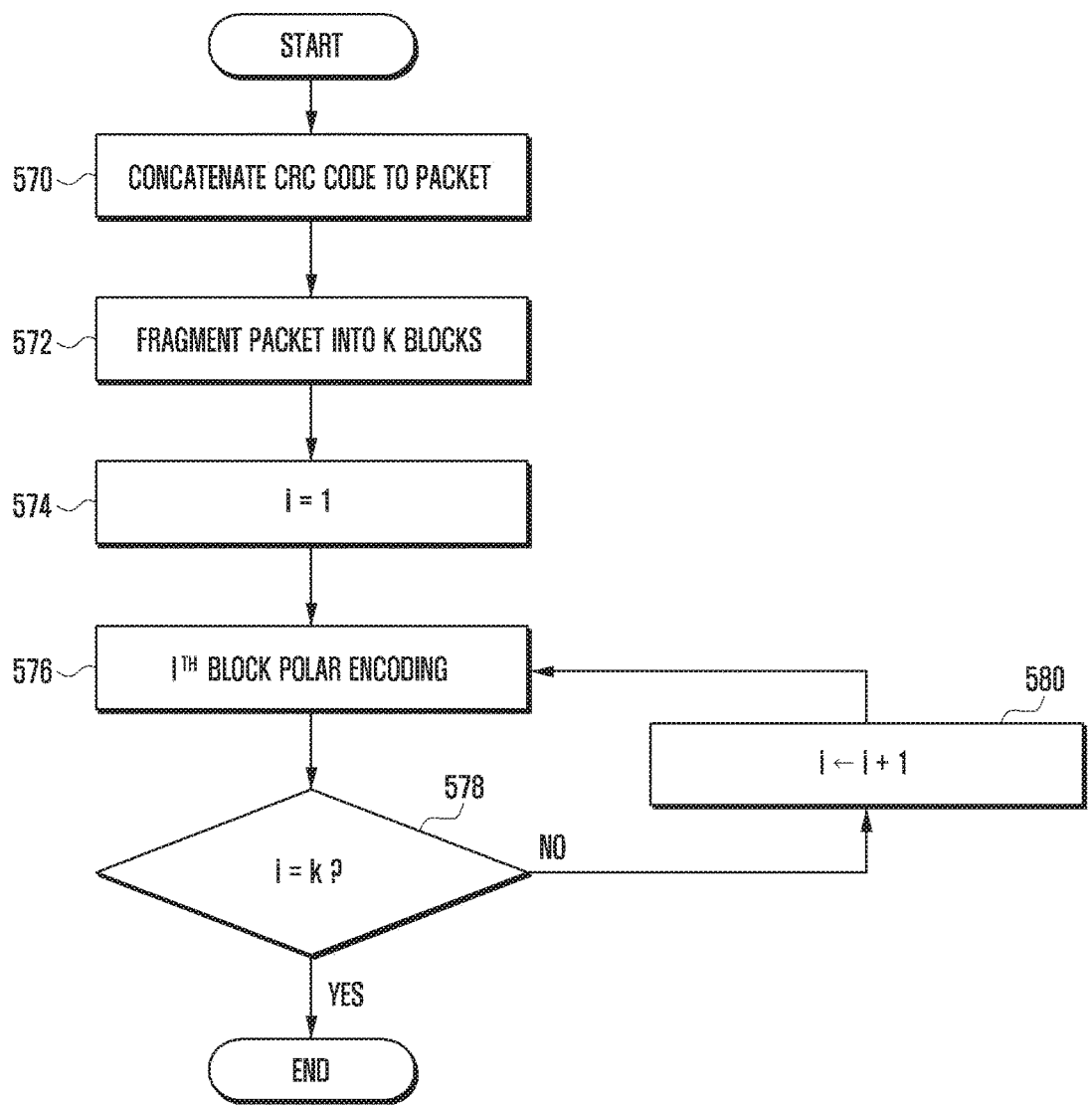
FIG. 5B is a flowchart illustrating an encoding method according to an embodiment of the present disclosure.

FIG. 5B is a flowchart illustrating an encoding method according to an embodiment of the present disclosure.

Referring to FIG. 5A, the data to be transmitted by the transmitter is fragmented input multiple packets. A packet is segmented into a plurality of blocks. Each block is polar-coded by the polar coder without concatenation of any block CRC code. For example, each block has no CRC code. The coded blocks are transmitted to the receiver.

Referring to FIG. 5B, the transmitter (encoder) concatenates a packet CRC code 511 to the data to generate a packet 510 at operation 570. The transmitter splits the packet 510 into K blocks 520, 530, 540, and 550 at operation 572. K denotes a number of blocks constituting the packet. In the case of FIG. 5A, K=4.

Through operations 574, 576, 578, and 580, the transmitter performs polar coding on the individual blocks 520, 530, 540, and 550. Although the description is directed to the case of polar coding, the present disclosure is applicable to coding schemes without departing from the scope of the present disclosure. At operation 574, i is set to 1 (i=1). The transmitter performs polar coding on the $i^{th}$ block at operation 576. The transmitter determines whether i is equal to K (i=K) at operation 578. For example, the transmitter determines whether all of the blocks have been polar-coded. If not all of the blocks have been polar-coded, the transmitter increments i by 1 at operation 580. Afterward, the transmitter repeat operations 576, 578, and 580 until all of the blocks are polar-coded, i.e., until i=K.

Referring to FIG. 5A, the first block 520 is polar-coded by the polar coder 525, the second block 530 by the polar coder 535, the third block 540 by the polar coder 545, and the fourth block 550 by the polar coder 555.

Although FIG. 5B is directed to the case where the blocks are polar coded in series, some or all of the blocks may be coded simultaneously or independently.

The encoding method depicted in FIGS. 5A and 5B corresponds to the decoding method to be described with reference to FIGS. 6, 7, 8, 9, 10, and 11.

The packet encoder performing the encoding procedure as described with FIGS. 5A and 5B may include a communication unit and a control unit. The communication unit may transmit the blocks constituting the packet according to the encoding procedure described with reference to FIGS. 5A and 5B under the control of the control unit. The control unit controls the encoding apparatus to encode/generate the blocks to be transmitted according to the encoding procedure of FIGS. 5A and 5B.

In the present disclosure, two embodiments of the decoding procedure are proposed, and the proposed decoding procedures may operate independently.

Polar Code Decoding Procedure According to a First Embodiment

Figure 6:
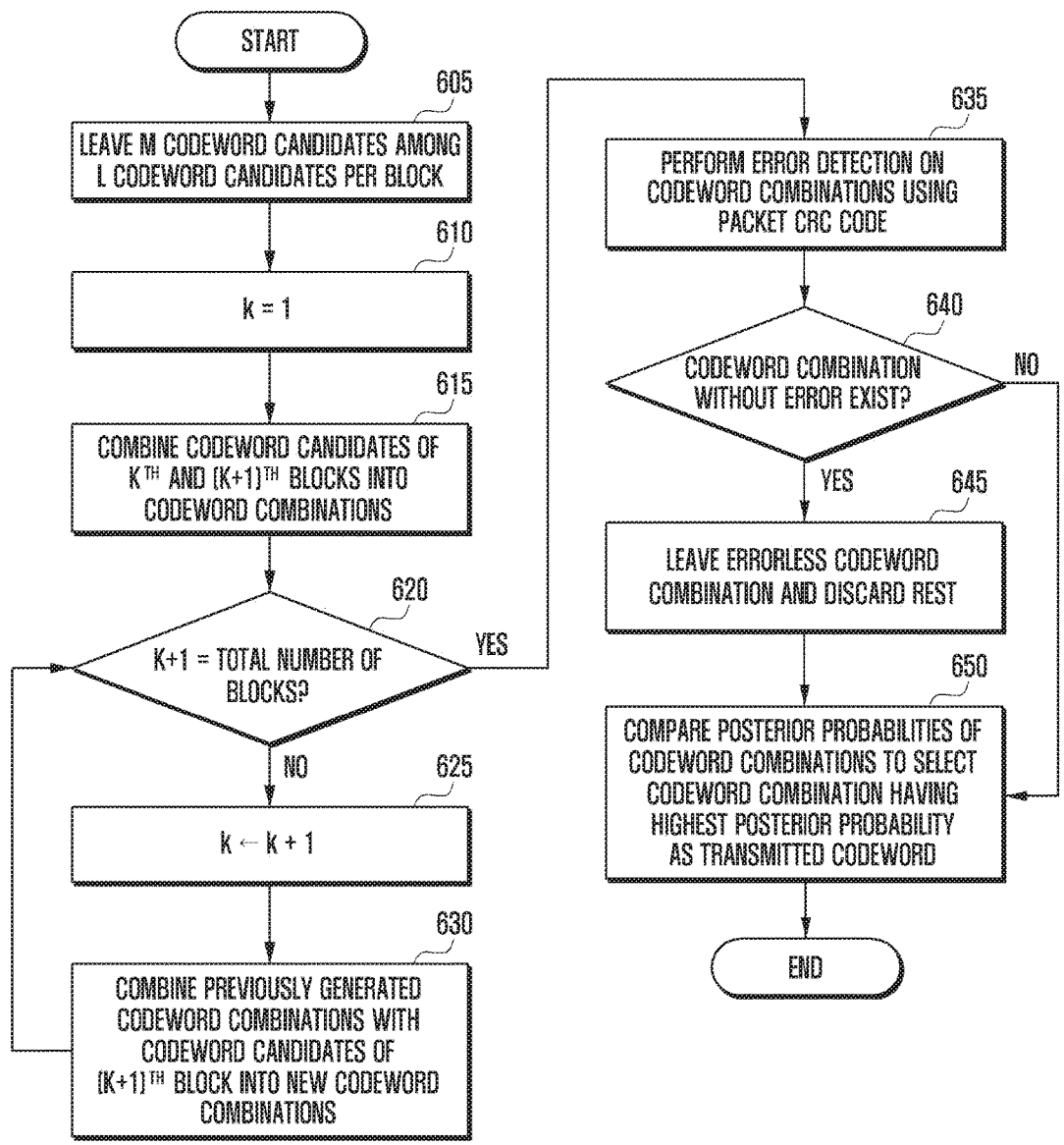
FIG. 6 is a flowchart illustrating a decoding procedure according to a first embodiment of the present disclosure.

FIG. 6 is a flowchart illustrating a decoding procedure according to the first embodiment of the present disclosure.

Figure 7:
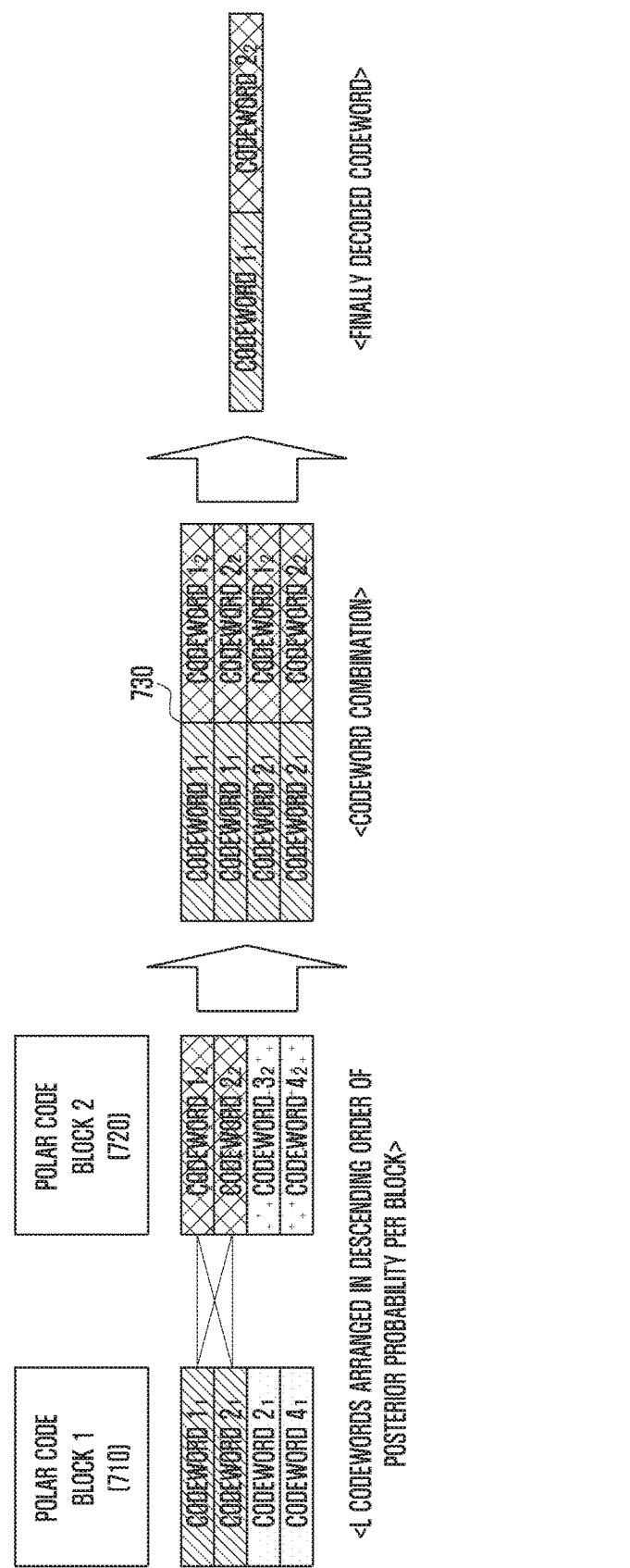
FIG. 7 is a diagram illustrating a decoding principle according to the first embodiment of the present disclosure.

FIG. 7 is a diagram illustrating a decoding principle according to the first embodiment of the present disclosure.

The packets carrying data is distorted by noise, multipath fading, interference, and the like, on the propagation channel to the receiver. In order to decode the signal correctly, the signal needs to be recovered. The received signal recovery procedure is described hereinafter.

Referring to FIGS. 6 and 7, the receiver (decoder) decodes the received signal by using the SCL decoder at operation 605. The SCL decoder processes the received signal vectors, i.e., polar code blocks 710 and 720, to generate L codeword candidates per polar code block. The receiver selects/acquires M codeword candidates having the highest posterior probability among the L codeword candidates per block. Here, M is an integer less than L. In the embodiment of FIGS. 7, L=4 and M=2. In the embodiment of FIG. 7, the L codeword candidates acquired from the polar code block 1 710 include codeword $1_1$, codeword $2_1$, codeword $3_1$, and codeword $4_1$. The receiver selects M codewords (i.e., codeword $1_1$ and codeword $2_1$) among these codeword candidates. Similarly, in the embodiment of FIG. 7, the L codeword candidates acquired from the polar code block 2 720 include codeword $1_2$, codeword $2_2$, codeword $3_2$, and codeword $4_2$. The receiver selects M codewords (i.e., codeword $1_2$ and codeword $2_2$) among these codeword candidates.

The receiver sets k to 1 at operation 610. The receiver generates combinations of codeword candidates of $k^{th}$ and $(k+i)^{th}$ blocks at operation 615. The receiver determines whether k+1 is equal to the number of blocks constituting a packet at operation 620. If it is determined at operation 620 that k+1 is less than the number of blocks constituting a packet, the receiver increment k by 1 at operation 625 and generates new combinations using the previously generated codeword combinations and the codeword candidates (M) of the $(k+1)^{th}$ block at operation 630. This process is repeated until k+1 reaches the number of blocks constituting a packet. In the embodiment of FIG. 7, K (that is, the number of blocks constituting a packet) is 2. Accordingly, single stage of k=1 is performed.

The receiver combines M codewords (i.e., codeword $1_1$ and codeword $2_1$) acquired from the polar code block 1 710 and M codewords (i.e., codeword $1_2$ and codeword $2_2$) acquired from the polar code block 2 720. This generates four codeword combinations as denoted by reference number 730. If M is identical in all of the blocks, the number of codeword combinations is $M^K$.

If it is determined at operation 620 that k+1 reaches the number of blocks constituting a packet, the receiver performs error detection on the codeword combinations 730 using the packet CRC code at operation 635. The receiver determines whether there is any codeword combination having no error at operation 640. If it is determined at operation 640 that there is no codeword combination without error, the receiver selects all of the codeword combinations and the procedure goes to operation 650. However, if it is determined at operation 640 that there is any codeword combination without error, the procedure goes to operation 645. At operation 645, the receiver selects the codeword combination(s) without error and discards the rest. At operation 650, the receiver calculates the posterior probabilities of the codeword combinations and selects the codeword combination having the highest posterior probability.

According to an alternative embodiment, if there is no codeword combination without error at operation 640, the receiver regards this as reception failure and sends the transmitter a NACK. Operations 635, 640, 645, and 650 are the process of selecting a codeword combination having the highest posterior probability among the codeword combinations that passed the CRC test. Accordingly, it is possible to acquire the same result by performing CRC test on the codeword combinations in the descending order of posterior probability.

The posterior probability of the codeword combination is calculated as the product of the posterior probabilities of the combined codewords. For example, if the posterior probabilities of the combined codewords $1_1$ and $2_2$ are a and b respectively, the posterior probability of the codeword probability is a×b. The receiver performs decoding on the selected combination at operation 650 and, if the combination is decoded successfully, sends an ACK to the transmitter.

In the above embodiment, M is set arbitrarily at operation 605. However, M may be set as follows depending on the embodiment.

P (codeword $X_k$) denotes the posterior probability of the codeword having $X^{th}$ highest posterior probability in the codeword candidate list corresponding to $k^{th}$ codeword block. The threshold value is expressed as Th. The size of M may be set differently or identically for the blocks. In the following, the description is directed to the case where the size of M is set differently for the blocks. M is equal to or less than L. However, M has to be set to a value less than L for at least one of the blocks. The receiver may set M to M1 if $f(P(1_t), \ldots, P(L_t))$ is equal to or greater than Th for the $t^{th}$ block. In contrast, if $f(P(1_t), \ldots, P(L_t)) < Th$, the receiver may set M to M2. Here, the function f( ) is the function having the code block of the corresponding block as input.

For example, $f(P(1_k), \ldots, P(L_k)) = P(1_k) - P(2_k)$. For example, if the difference between the highest and the second highest posterior probabilities among the posterior probabilities of the L codewords acquired from the $k^{th}$ block is equal to or greater than the threshold value, M=M1. This means that M for the $k^{th}$ block is set to M1 if $P(1_k)-P(2_k) \geq Th$. In contrast, M for the $k^{th}$ block may be set to M2=M−1+1 if $P(1_k)-P(2_k)<Th$. The receiver may determine the size of the threshold value depending on the channel condition.

The embodiment of FIG. 6 is directed to the case where the combination is performed in sequence. However, the combination may be performed in reverse order (i.e., in the order of $K^{th}$, $(K-1)^{th}$, ..., first block). In the system capable of using multiple processors, it is possible to combine multiple pairs of blocks simultaneously, e.g., pair of the first and second blocks and pair of the third and fourth block. This alternative method may be applicable to the second embodiment described below.

Figure 8:
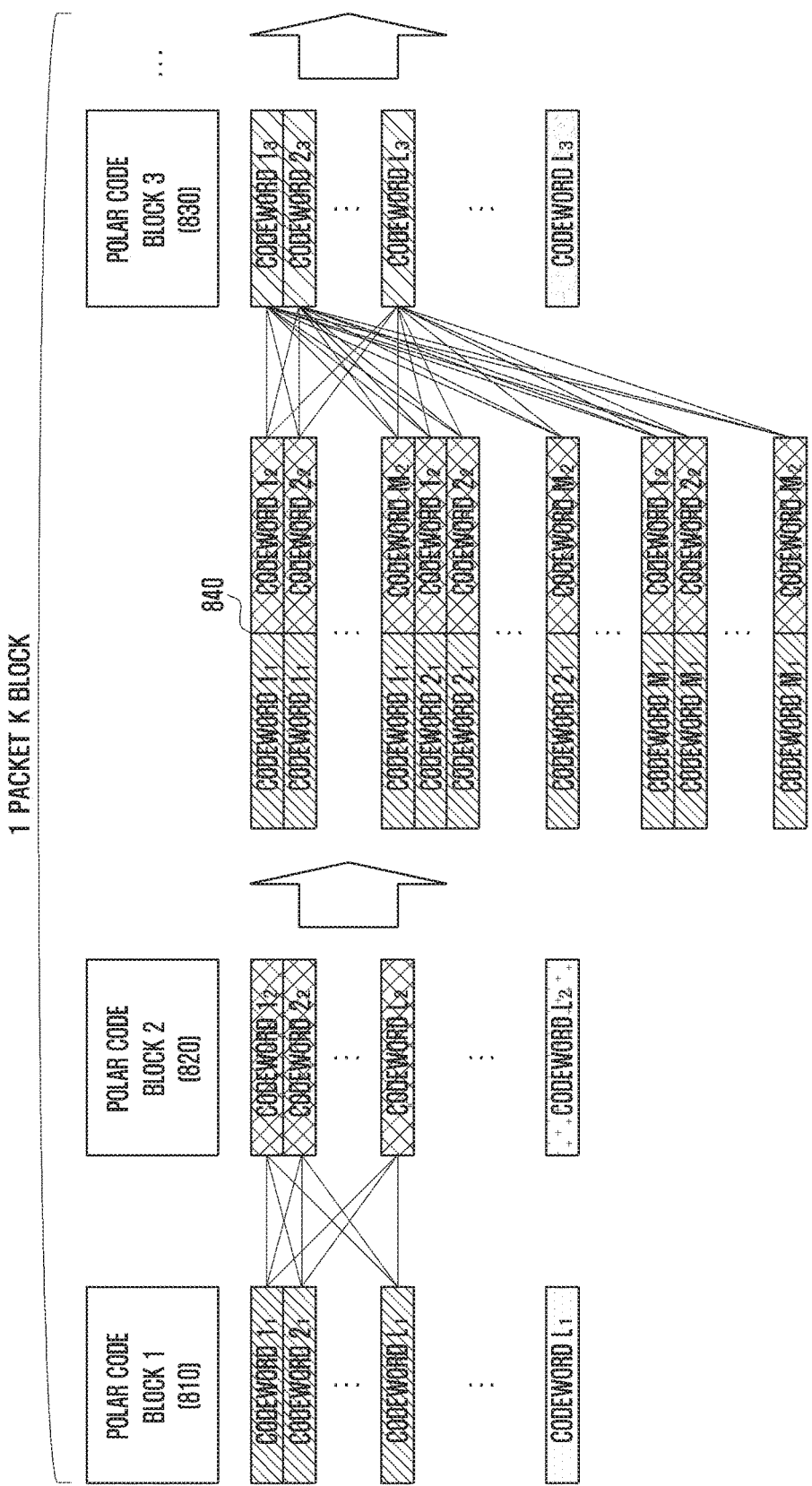
FIG. 8 is a diagram illustrating a principle of a decoding procedure according to the first embodiment of the present disclosure.

FIG. 8 is a diagram illustrating a principle of a decoding procedure according to the first embodiment of the present disclosure. Although L, K, and M are set to small values to simplify the explanation in the embodiment of FIG. 7, FIG. 8 shows more general case as compared to the embodiment of FIG. 7.

Referring to FIG. 8, a packet consists of K blocks. The polar code block 1 810 is the first polar-coded block of the packet. The codewords 810, 820, and 830 depicted below the respective blocks are L codeword candidates decoded by the SCL decoder. The L codeword candidates are arranged in the descending order of the posterior probability from top to bottom. For example, the codeword $2_1$ is the codeword having the second highest posterior probability among the codeword candidates of the polar code block 1 810.

For the polar code block 1 810, M codewords ($1_1$, $2_1$, ..., $M_1$) are selected. For the polar code block 2 830, M codewords ($1_2$, $2_2$, ..., M2) are selected. At operation 615 of FIG. 6, the combinations of the codewords ($1_1$, $2_1$, ..., $M_1$) and ($1_2$, $2_2$, ..., $M_2$) are generated and denoted by reference number 840. Thereafter, the combinations 840 and M codewords ($1_3$, $2_3$, ..., $M_3$) corresponding to the polar code block 1 830 are combined and this process is repeated for K blocks capable of forming one packet.

Polar Code Decoding Procedure According to a Second Embodiment

The polar code decoding procedure according to the second embodiment is similar to the polar code decoding procedure of the first embodiment in generating the codeword combinations of the blocks with the exception that a number of combinations having the highest posterior probabilities are selected among the codeword combinations between the blocks and the rest are discarded.

Figure 9:
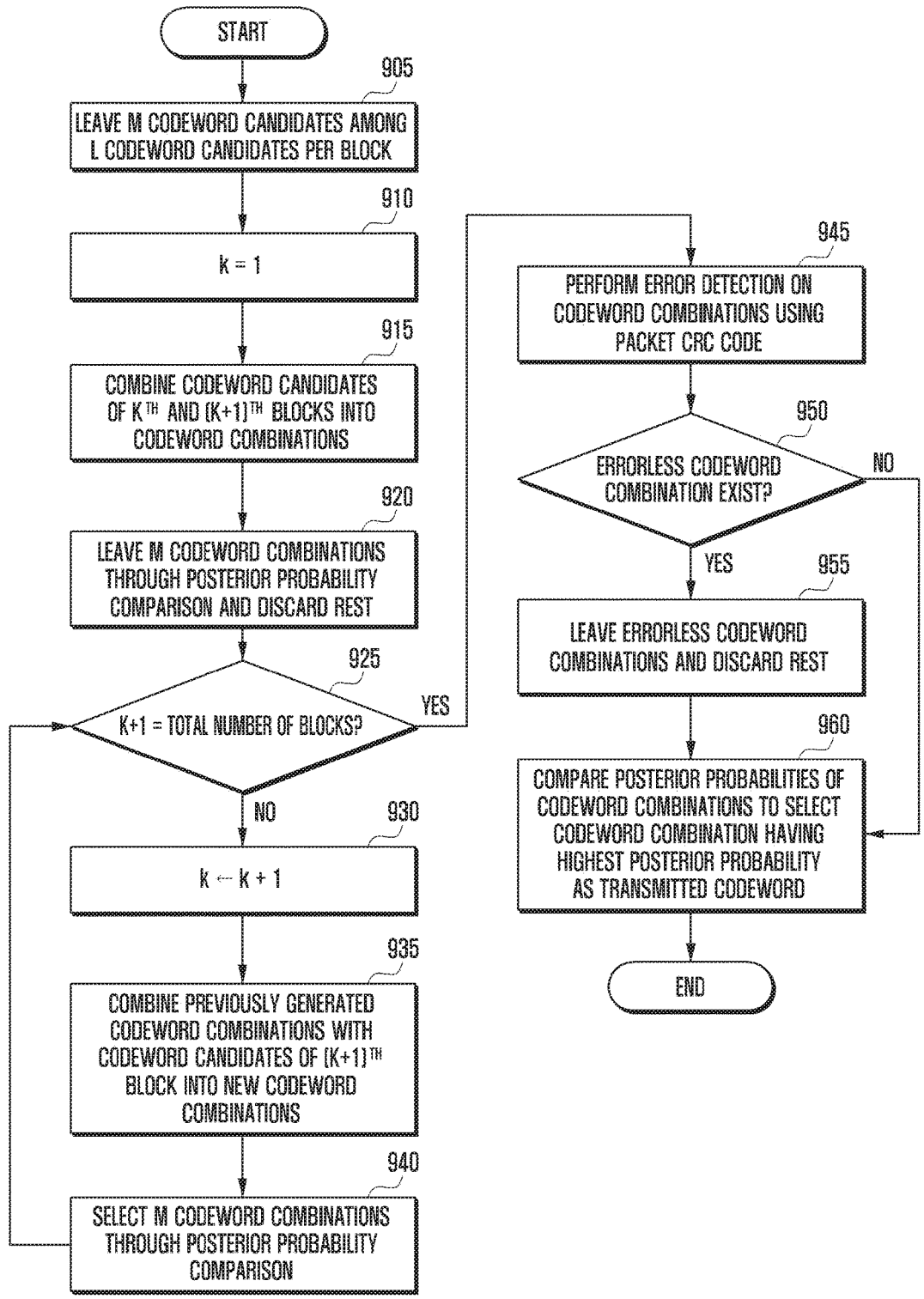
FIG. 9 is a flowchart illustrating a polar code decoding procedure according to a second embodiment of the present disclosure.

FIG. 9 is a flowchart illustrating a polar code decoding procedure according to the second embodiment of the present disclosure.

Figure 10:
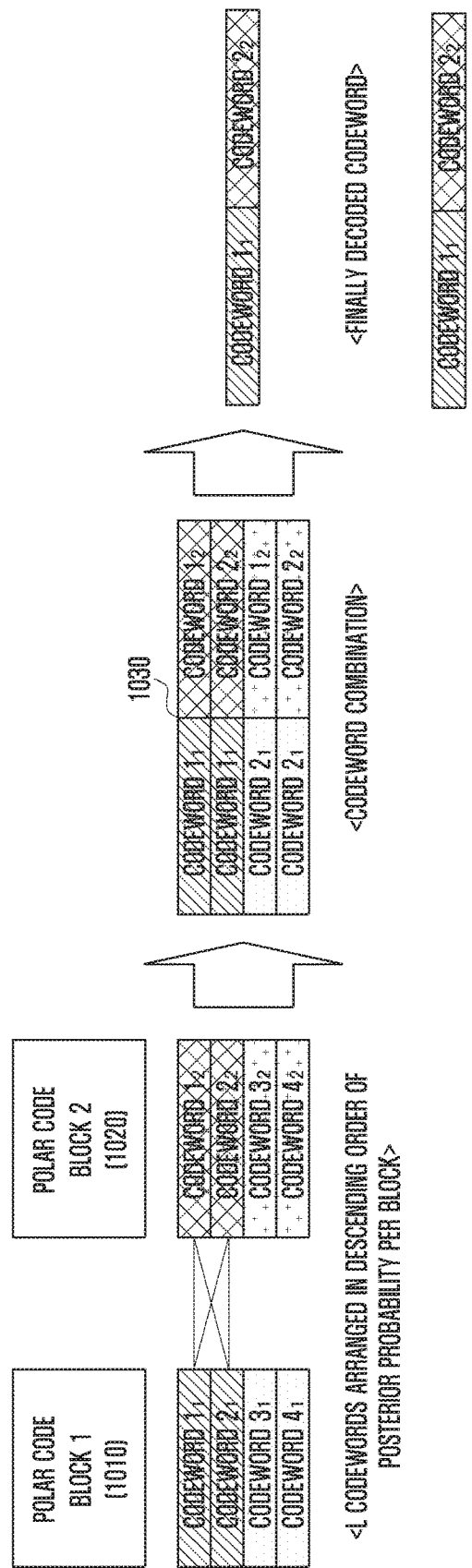
FIG. 10 is a diagram illustrating a procedure of decoding a polar code according to the second embodiment of the present disclosure.

FIG. 10 is a diagram illustrating a procedure of decoding a polar code according to the second embodiment of the present disclosure.

Referring to FIGS. 9 and 10, the receiver (decoder) decodes the received signals by using the SCL decoder at operation 905. The SCL decoder processes the received signal vectors, i.e., polar code blocks 1010 and 1020, to generate L codeword candidates per polar code block. The receiver selects/acquires M codeword candidates having the highest posterior probability among the L codeword candidates per block. Here, M is an integer less than L. In the embodiment of FIGS. 10, L=4 and M=2. In the embodiment of FIG. 10, the L codeword candidates acquired from the polar code block 1 1010 include codeword $1_1$, codeword $2_1$, codeword $3_1$, and codeword $4_1$. The receiver selects M codewords (i.e., codeword $1_1$, codeword $2_1$) among these codeword candidates. Similarly, in the embodiment of FIG. 10, the L codeword candidates acquired from the polar code block 2 1020 include codeword $1_2$, codeword $2_2$, codeword $3_2$, and codeword $4_2$. The receiver selects M codewords (i.e., codeword $1_2$, codeword $2_2$) among these codeword candidates.

The receiver sets k to 1 at operation 910. The receiver generates combinations of codeword candidates of $k^{th}$ and $(k+i)^{th}$ blocks at operation 915. The receiver selects M codeword combinations having the highest posterior probabilities among the generated codeword combinations and rules out the rest at operation 920. The posterior probability of the codeword combination is identical with the posterior probability of the codeword combination in the first embodiment. Although the same value of M is used for selecting some of the codeword candidates at operation 905 and some of codeword combinations at operation 920, different values may be used at operations 905 and 920 in an alternative embodiment.

The receiver determines whether k+1 is equal to the number of blocks constituting one packet at operation 925. If it is determined at operation 925 that k+1 is less than the number of blocks constituting one packet, the receiver increments k by 1 at operation 930 and generates new codeword combinations using the previously generated codeword combinations and the codeword candidates (M) of the (k+1)th block at operation 935. The receiver selects M codeword combinations having the highest posterior probabilities among the generated codeword combinations at operation 940. The process is repeated until the k+1 reaches the number of blocks constituting one packet. In the embodiment of FIG. 10, K is 2. Accordingly, single stage of k=1 is performed.

The receiver combines M codewords (i.e., codeword $1_1$, codeword $2_1$) acquired from the polar code block 1 1010 and m codewords (i.e., codeword $1_2$, codeword $2_2$) acquired from the polar code block 2 1020. As a consequence, four ($M^2$) codeword combinations are acquired as denoted by reference number 1030. The receiver selects M (i.e., 2) codeword combinations having the highest posterior probabilities among the four codeword combinations 1030. In the embodiment of FIG. 10, the codeword combination of codewords $1_1$ and $1_2$ and the codeword combination of codewords $1_1$ and $2_2$ are selected as M codeword combinations having the highest posterior probabilities.

The receiver performs error detection on the codeword combinations 1030 using the packet CRC code at operation 945. The receiver determines whether there is any codeword combination without error at operation 950. If there is no codeword combination without error, the receiver selects all of the codeword combinations and the procedure goes to operation 960. If there is any code combination without error, the procedure goes to operation 955. At operation 955, the receiver calculates the posterior probability of each codeword combination and selects the codeword combination having the highest posterior probability.

According to an alternative embodiment of the present disclosure, if there is no codeword combination without error at operation 950, the receiver regards this as reception failure and sends the transmitter a NACK.

Operations 945, 950, 955, and 960 are the process of selecting a codeword combination having the highest posterior probability among the codeword combinations that passed the CRC test without error. Accordingly, it is possible to acquire the same result by performing CRC test on the codeword combinations in the descending order of posterior probability.

At operation 960, the receiver performs decoding on the selected codeword combination and, if the codeword combination is decoded successfully, sends the transmitter an ACK.

In the above embodiment, M is set arbitrarily at operation 905. However, M may be set as follows depending on the embodiment.

P (codeword $X_k$) denotes the posterior probability of the codeword having $X^{th}$ highest posterior probability in the codeword candidate list corresponding to $k^{th}$ codeword block. The threshold value is expressed as Th. The size of M may be set differently or identically for the blocks. In the following, the description is directed to the case where the size of M is set differently for the blocks. M is equal to or less than L. However, M has to be set to a value less than L for at least one of the blocks. The receiver may set M to M1 if $f(P(1_t), \ldots, P(L_t))$ is equal to or greater than Th for the $t^{th}$ block. In contrast, if $f(P(1_t), \ldots, P(L_t))<$Th, the receiver may set M to M2. Here, the function f( ) is the function having the code block of the corresponding block as input.

For example, $f(P(1_k), \ldots, P(L_k))=P(1_k)-P(2_k)$. For example, if the difference between the highest and the second highest posterior probabilities among the posterior probabilities of the L codewords acquired from the $k^{th}$ block is equal to or greater than the threshold value, M=M1. This means that M for the $k^{th}$ block is set to M1 if $P(1_k)-P(2_k)\geq$Th. In contrast, M for the $k^{th}$ block may be set to M2=M-1+1 if $P(10-P(2_k)<$Th. The receiver may determine the size of the threshold value depending on the channel condition.

The posterior probability of the codeword combination is calculated as the product of the posterior probabilities of the combined codewords as in the first embodiment.

Figure 11:
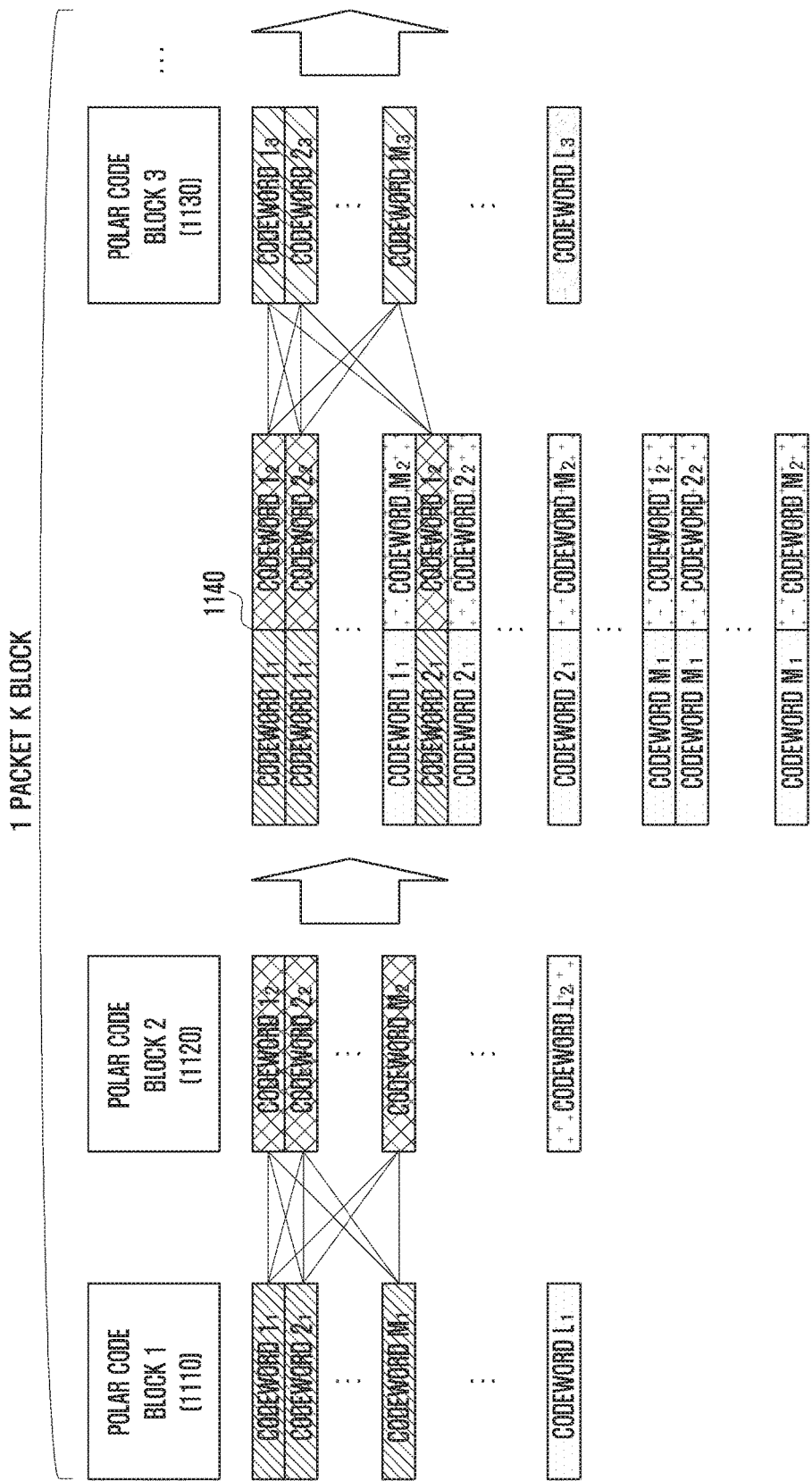
FIG. 11 is a diagram illustrating a principle of a decoding procedure according to the second embodiment of the present disclosure.

FIG. 11 is a diagram illustrating a principle of a decoding procedure according to the second embodiment of the present disclosure. Although L, K, and M are set to small values to simplify the explanation in the embodiment of FIG. 10, FIG. 11 shows more general case as compared to the embodiment of FIG. 10.

Referring to FIG. 11, a packet consists of K blocks. The individual blocks 1110, 1120, and 1130 are decoded by the SCL decoder. In this embodiment, M codeword combinations are selected among $M^2$ codeword combinations 1140 generated differently, and the selected codeword combinations are used for combination with the next block.

The packet decoding apparatus for performing the procedures of the first and second embodiments may include a communication unit and a control unit. The communication unit may receive/acquire the blocks constituting the packet under the control of the control unit as described in the first and second embodiments. The control unit controls the decoding apparatus to decode the received blocks according to any of the first and second embodiments.

The decoding method according to an embodiment of the present disclosure is capable of improving decoding performance of the polar code concatenated in a unit of packets as compared to the method of the related art.

Figure 12:
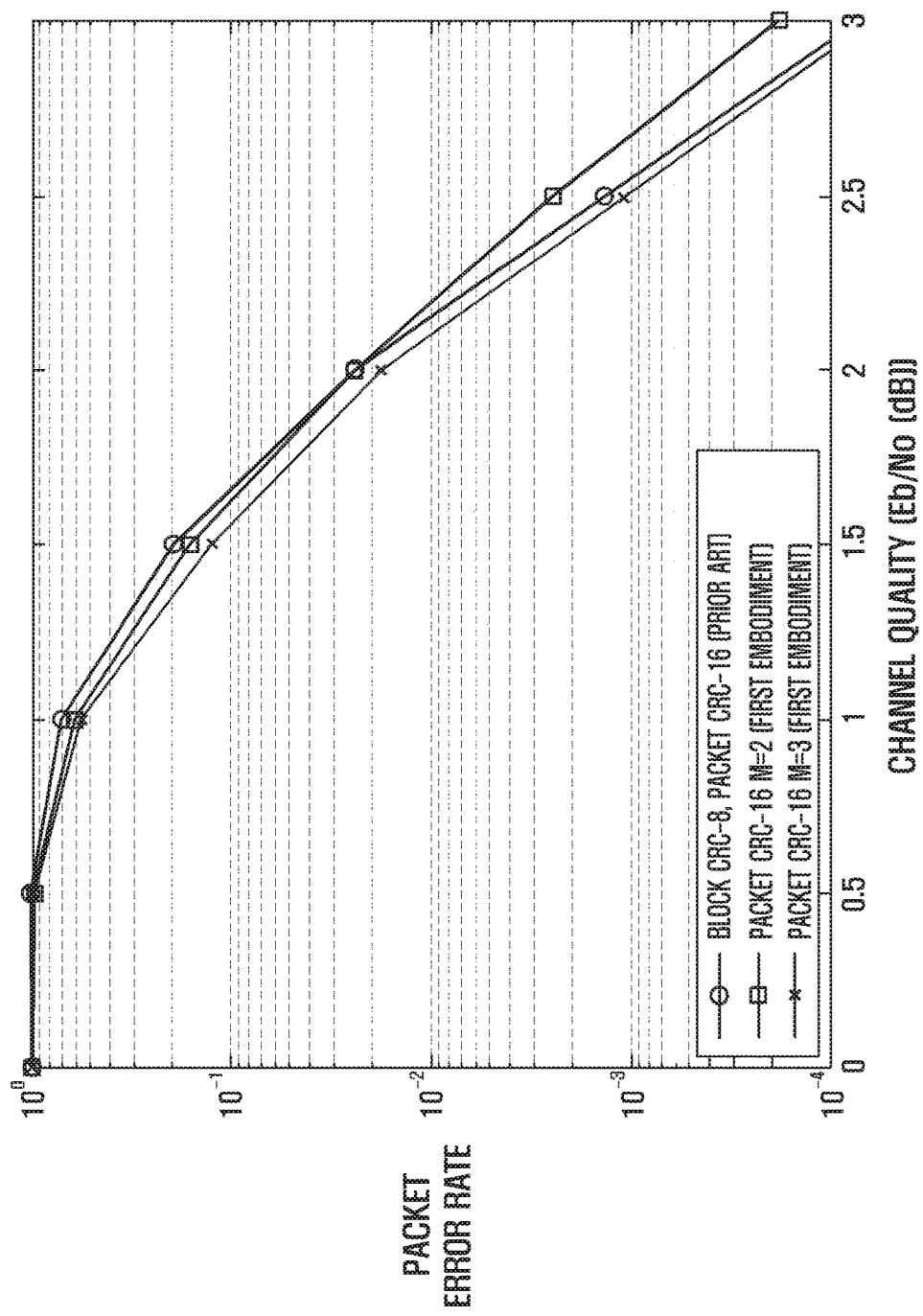
FIGS. 12, 13, and 14 are graphs illustrating performance comparison results between the method of the related art and the proposed method according to an embodiment of the present disclosure.
Figure 13:
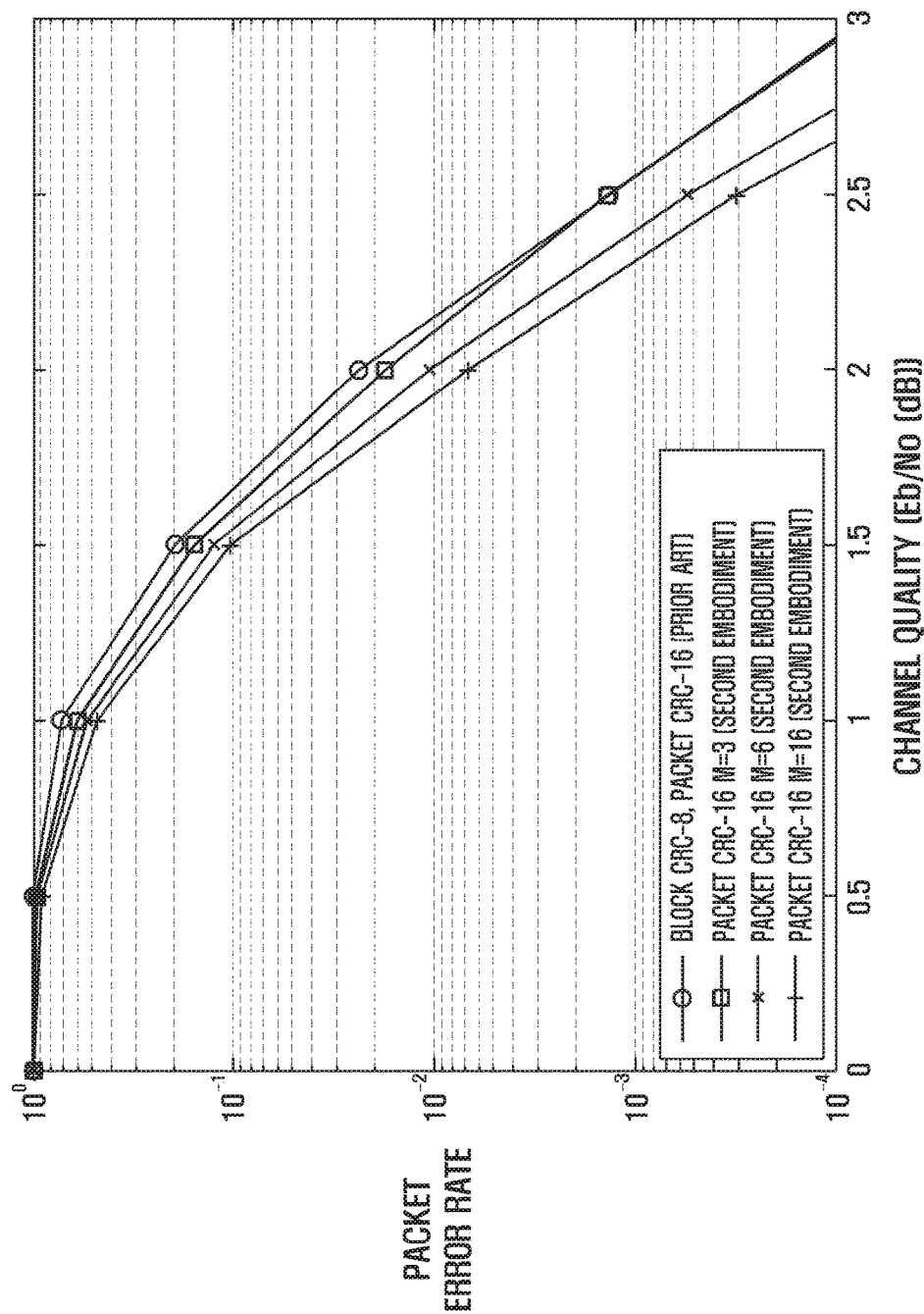
Figure 14:
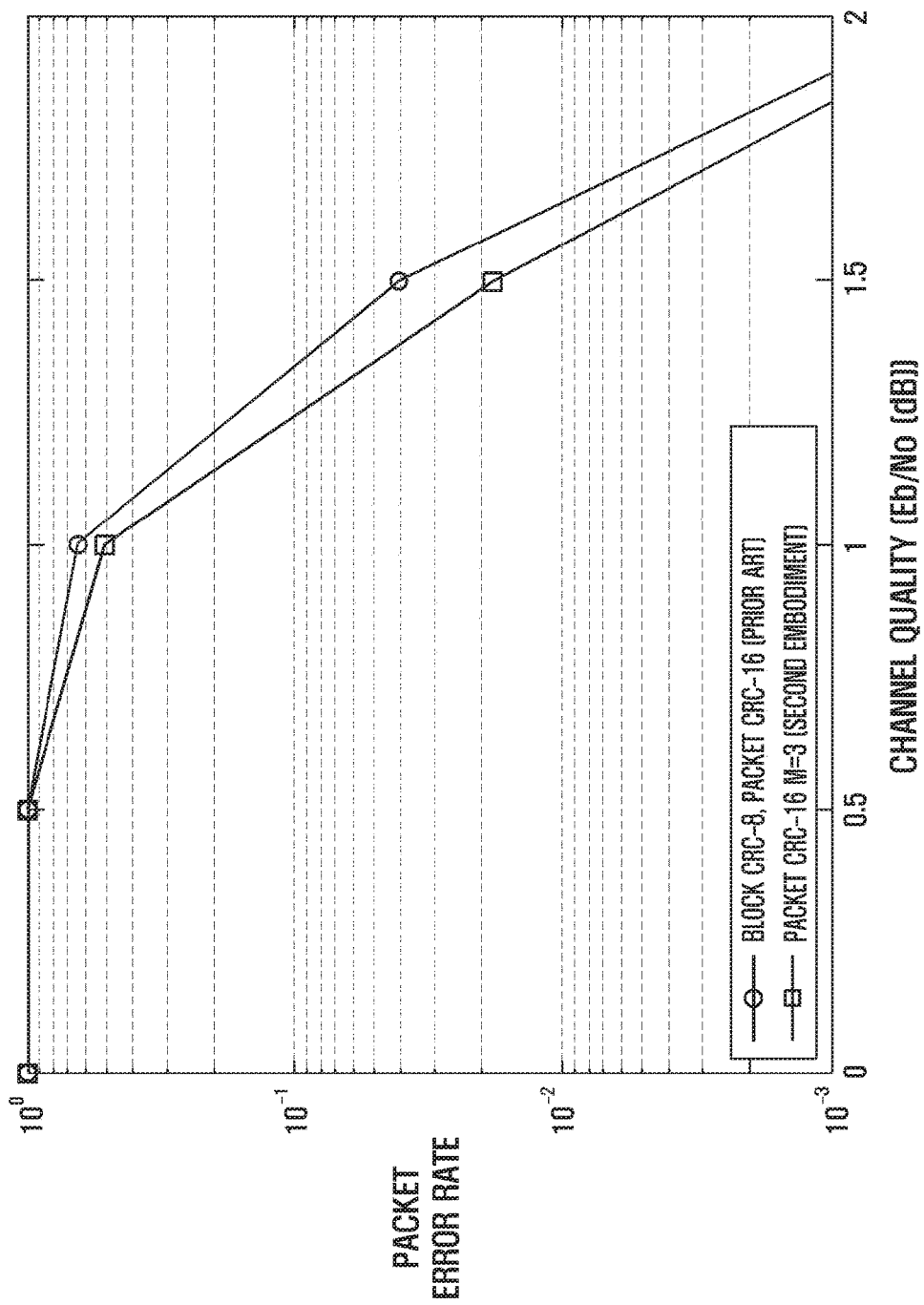

FIGS. 12, 13, and 14 are graphs illustrating performance comparison results between the method of the related art and the proposed method according to an embodiment of the present disclosure.

In FIGS. 12 and 13, the block code length is 512, the coding rate is 0.5, the SCL decoder list size L is 4, and each packet consists of 4 blocks.

FIG. 12 shows the performance analysis result on the first embodiment.

Referring to FIG. 12, the performance comparison is made between the method of the related art and the proposed method according to the first embodiment when M is 2 and 3. In the case of M=2, the proposed method shows superior performance as compared to the method of the related art below the channel quality of 2 dB but inferior performance as compared to the method of the related art over the channel quality of 2 dB. In the case of M=3, the proposed method shows superior performance as compared to the method of the related art over the entire channel quality range.

FIG. 13 shows the performance analysis result of the second embodiment.

Referring to FIG. 13, it shows the performance comparison when the CL is fixed to 3, 6, and 16. In the case of CL=3, the performance of the proposed method is almost equal to that of the method of the related art. In the cases of CL=6 and 16, the proposed method shows the performance improvements of about 0.3 dB and 0.4 dB respectively at the packet error rate of $10^{-4}$.

Referring to FIG. 14, it also shows the performance analysis result of the second embodiment. In FIG. 13, the block code length is 2048, the coding rate is 0.5, the SCL decoder list size L is 4, and each packet consists of 4 blocks. When CL is fixed to 3, the proposed method of the second embodiment shows the performance gain of about 0.1 dB at the packet error rate of $10^{-3}$ as compared to the method of the related art.

As described above, the packet encoding and decoding apparatus and method of the present disclosure is capable of encoding and decoding packets efficiently.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, a special purpose computer, or other programmable data processing apparatus to produce a machine, such that the instructions, which execute via the processor of the computer or other programmable data processing apparatus, implement the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks. The computer program instructions may also be loaded onto a computer or other programmable data processing apparatus to cause a series of operational operations to be performed on the computer or other programmable apparatus to produce a computer implemented process such that the instructions which execute on the computer or other programmable apparatus provide operations for implementing the functions/acts specified in the flowchart and/or block diagram block or blocks.

Furthermore, the respective block diagrams may illustrate parts of modules, segments or codes including at least one or more executable instructions for performing specific logic function(s). Moreover, it should be noted that the functions of the blocks may be performed in different order in several modifications. For example, two successive blocks may be performed at the same time, or may be performed in reverse order according to their functions.

The term "module" according to the embodiments of the disclosure, means, but is not limited to, a software or hardware component, such as a Field Programmable Gate Array (FPGA) or an Application Specific Integrated Circuit (ASIC), which performs certain tasks. A module may advantageously be configured to reside on the addressable storage medium and configured to be executed on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules. In addition, the components and modules may be implemented such that they execute one or more Central Processing Units (CPUs) in a device or a secure multimedia card.

Figure 15:
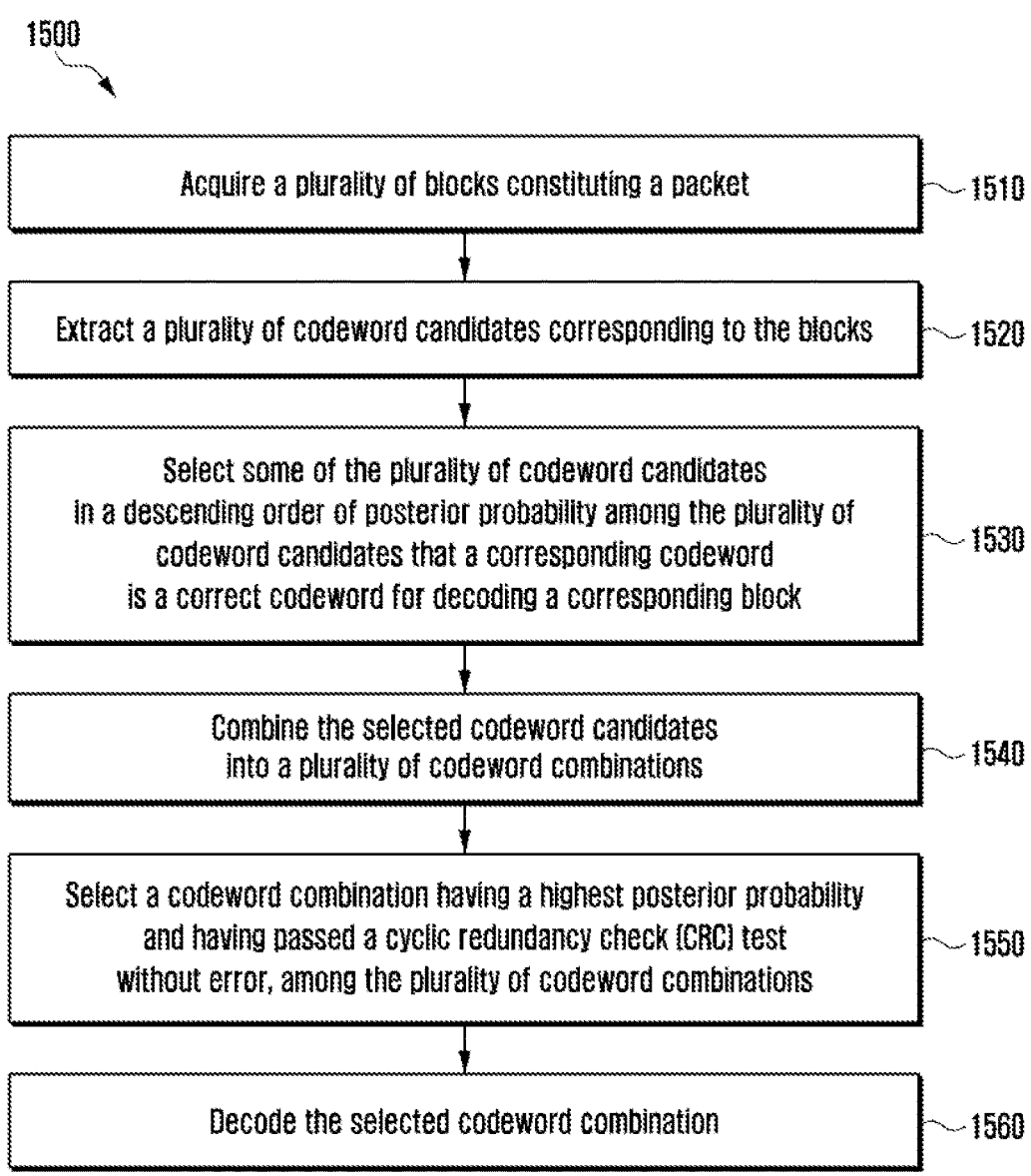
FIG. 15 is a flowchart illustrating a procedure for decoding a packet comprising a plurality of blocks according to a second embodiment of the present disclosure.

FIG. 15 illustrates a procedure 1500 for decoding a packet comprising a plurality of blocks, according to an embodiment. At block 1510, the plurality of blocks constituting the packet are acquired. At block 1520, a plurality of codeword candidates are extracted corresponding to the blocks. At block 1530, some of the plurality of codeword candidates are selected in a descending order of posterior probability among the plurality of codeword candidates that a corresponding codeword is a correct codeword for decoding a corresponding block. At block 1540, the selected codeword candidates are combined into a plurality of codeword combinations. At block 1550, a codeword combination is selected having a highest posterior probability and having passed a cyclic redundancy check (CRC) test without error, among the plurality of codeword combinations. Finally, at block 1560, the selected codeword combination is decoded.

Figure 16:
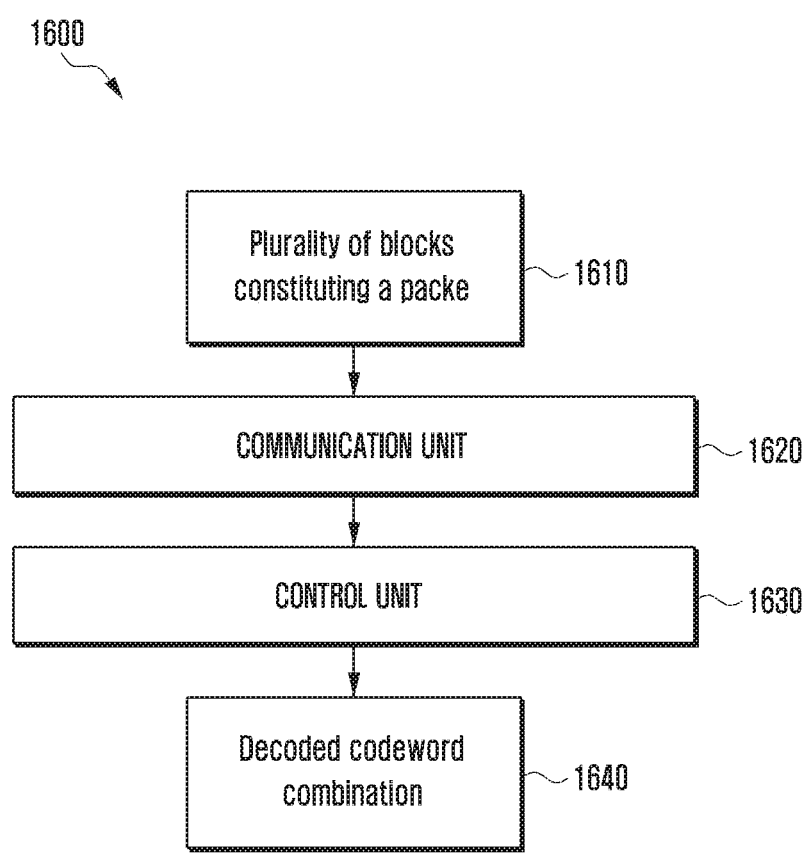
FIG. 16 is a diagram illustrating an apparatus for decoding a packet comprising a plurality of blocks, according to an embodiment of the present disclosure.

FIG. 16 illustrates an apparatus 1600 for decoding a packet comprising a plurality of blocks. Apparatus 1600 has a communication unit 1620 configured to receive the plurality of blocks constituting the packet 1610. A control unit 1630 is configured to acquire the plurality of blocks constituting the packet from communication unit 1620, extract a plurality of codeword candidates corresponding to the blocks, and select some of the plurality of codeword candidates in a descending order of posterior probability among the plurality of codeword candidates that a corresponding codeword is a correct codeword for decoding a corresponding block. Control unit 1630 is further configured to combine the selected codeword candidates into a plurality of codeword combinations, and select a codeword combination having a highest posterior probability and having passed a cyclic redundancy check (CRC) test without error among the plural codeword combinations. Finally, control unit 1630 is further configured to decode the selected codeword combination into a decoded codeword combination 1640.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for decoding a packet comprising a plurality of blocks, the method comprising:
acquiring the plurality of blocks constituting the packet;
extracting a plurality of codeword candidates corresponding to the blocks;
selecting some of the plurality of codeword candidates in a descending order based on a posterior probability among the plurality of codeword candidates, that a corresponding codeword is a correct codeword for decoding a corresponding block;
combining the selected codeword candidates into a plurality of codeword combinations;
selecting a codeword combination having a highest posterior probability and having passed a cyclic redundancy check (CRC) test without error, among the plurality of codeword combinations; and
decoding the selected codeword combination.

2. The method of claim 1,
wherein the packet comprises K blocks, K being an integer greater than 1, and
wherein the combination of the selected codeword candidates into the plurality of codeword combinations comprises:
combining first codeword candidates selected in the descending order of posterior probability among the codeword candidates corresponding to a first block of the K blocks and combining second codeword candidates selected in the descending order of posterior probability among the codeword candidates corresponding to a second block of the K blocks, into codeword combinations; and
acquiring entire codeword combinations for first to $K^{th}$ blocks by repeating the combining of the combined codeword combinations and next codeword candidates.

3. The method of claim 2,
wherein the combining of the selected codeword candidates into the plurality of codeword combinations further comprises selecting some codeword candidate combination in the descending order of the posterior probability among the codeword candidates combined after combining the first and second codeword candidates, and
wherein the combining of the selected codeword combination and the next codeword candidates is repeated to generate the entire codeword combinations for the first to $K^{th}$ blocks.

4. The method of claim 1, wherein the selecting of some of the codeword candidates comprises:
determining a number of codeword candidates to be selected per block (M) based on the posterior probability, M being an integer greater than 1; and
selecting M codeword candidates in the descending order of the posterior probability among the plurality of codeword candidates.

5. The method of claim 4, wherein the determining of the number of codeword candidates to be selected per block (M) based on the posterior probability comprises determining M based on highest and second highest posterior probabilities of the codeword candidates among the posterior probabilities of the plurality of codeword candidates.

6. The method of claim 1, wherein the combining of the selected codeword candidates into the plurality of codeword combinations is performed in a reverse order.

7. An apparatus for decoding a packet comprising a plurality of blocks, the apparatus comprising:
a receiver configured to receive the plurality of blocks constituting the packet; and
at least one processor configured to:
acquire the plurality of blocks constituting the packet,
extract a plurality of codeword candidates corresponding to the blocks,
select some of the plurality of codeword candidates in a descending order based on a posterior probability among the plurality of codeword candidates, that a corresponding codeword is a correct codeword for decoding a corresponding block, combine the selected codeword candidates into a plurality of codeword combinations, select a codeword combination having a highest posterior probability and having passed a cyclic redundancy check (CRC) test without error among the plural codeword combinations, and decode the selected codeword combination.

8. The apparatus of claim 7, wherein the packet comprises K blocks, K being an integer greater than 1, and the at least one processor is further configured to:

combine first codeword candidates selected in the descending order of posterior probability among the codeword candidates corresponding to a first block of the K blocks, combine second codeword candidates selected in the descending order of posterior probability among the codeword candidates corresponding to a second block of the K blocks into codeword combinations, and acquire entire codeword combinations for first to $K^{th}$ blocks by repeating the combining of the combined codeword combinations and next codeword candidates.

9. The apparatus of claim 8, wherein the at least one processor is further configured to:

select some codeword candidate combination in the descending order of the posterior probability among the codeword candidates combined after combining the first and second codeword candidates, and repeat combining of the selected codeword combination and the next codeword candidates to generate the entire codeword combinations for the first to $K^{th}$ blocks.

10. The apparatus of claim 7, wherein the at least one processor is further configured to:

determine a number of codeword candidates to be selected per block (M) based on the probability among the plurality of codeword candidates, M being an integer greater than 1, and select M codeword candidates in the descending order of the posterior probability among the plurality of codeword candidates.

11. The apparatus of claim 10, wherein the at least one processor is further configured to determine the number of codeword candidates to be selected per block (M) based on the posterior probability by determining M based on highest and second highest posterior probabilities of the codeword candidates among the posterior probabilities of the plurality of codeword candidates.

12. The apparatus of claim 7, wherein the selected codeword candidates are combined into the plurality of codeword combinations in a reverse order.

* * * * *